(12) United States Patent
Chae et al.

(10) Patent No.: US 7,687,300 B2
(45) Date of Patent: Mar. 30, 2010

(54) METHOD OF DYNAMIC TEMPERATURE CONTROL DURING MICROCRYSTALLINE SI GROWTH

(75) Inventors: Yong Kee Chae, Pleasanton, CA (US); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 77 days.

(21) Appl. No.: 11/876,130

(22) Filed: Oct. 22, 2007

(65) Prior Publication Data

US 2009/0105873 A1 Apr. 23, 2009

(51) Int. Cl.
*H01L 21/00* (2006.01)
(52) U.S. Cl. .............................. 438/57; 338/2; 338/22 R
(58) Field of Classification Search ........................ None
See application file for complete search history.

(56) References Cited

U.S. PATENT DOCUMENTS

| | | | |
|---|---|---|---|
| 4,830,038 A | 5/1989 | Anderson et al. | |
| 5,008,062 A | 4/1991 | Anderson et al. | |
| 5,324,365 A | 6/1994 | Niwa | |
| 5,420,043 A | 5/1995 | Niwa | |
| 5,571,749 A | 11/1996 | Matsuda et al. | |
| 5,578,501 A | 11/1996 | Niwa | |
| 5,589,007 A | 12/1996 | Fujioka et al. | |
| 5,863,412 A | 1/1999 | Ichinose et al. | |
| 6,032,724 A | 3/2000 | Hatta et al. | |
| 6,488,995 B1 | 12/2002 | Nishimoto et al. | |
| 6,548,380 B1 | 4/2003 | Goto et al. | |
| 6,787,692 B2 * | 9/2004 | Wada et al. | 136/256 |
| 6,846,728 B2 | 1/2005 | Goto et al. | |
| 6,858,308 B2 | 2/2005 | Kondo et al. | |
| 6,949,722 B2 * | 9/2005 | Strang et al. | 219/444.1 |
| 6,963,120 B2 | 11/2005 | Shiozaki et al. | |

(Continued)

FOREIGN PATENT DOCUMENTS

WO WO-2007118252 10/2007

(Continued)

OTHER PUBLICATIONS

Bau, "High-temperature CVD silicon films for crystalline silicon thin-film solar cells" Dissertation: University of Konstanz, Fachbereich für Physik, 2003.

(Continued)

*Primary Examiner*—Ha Tran T Nguyen
*Assistant Examiner*—Shantanu C Pathak
(74) *Attorney, Agent, or Firm*—Patterson & Sheridan, LLP (57) ABSTRACT

The present invention generally comprises a method for dynamically controlling the temperature of a solar cell substrate during microcrystalline silicon deposition. In amorphous silicon/microcrystalline tandem solar cells, microcrystalline silicon may be deposited using a higher power density and to a greater thickness than amorphous silicon. The higher the power density applied, the faster the deposition may occur, but the temperature of the deposition may also increase. At high temperatures, the likelihood of dopant diffusing into the intrinsic layer of the solar cell and damaging the cell is greater. By dynamically controlling the temperature of the susceptor, the substrate and hence, the dopant can be maintained at a substantially constant temperature below the value at which the dopant may diffuse into the intrinsic layer. The dynamic temperature control permits the microcrystalline silicon to be deposited at a high power density without damaging the solar cell.

5 Claims, 5 Drawing Sheets

U.S. PATENT DOCUMENTS

| | | |
|---|---|---|
| 7,049,004 B2 | 5/2006 | Domash et al. |
| 2003/0075717 A1 | 4/2003 | Kondo et al. |
| 2003/0087121 A1 | 5/2003 | Domash et al. |
| 2004/0062945 A1 | 4/2004 | Domash et al. |
| 2004/0149988 A1 | 8/2004 | Shiozaki et al. |
| 2004/0191950 A1 | 9/2004 | Nakamura |
| 2004/0210289 A1 | 10/2004 | Wang et al. |
| 2004/0254419 A1 | 12/2004 | Wang et al. |
| 2005/0025797 A1 | 2/2005 | Wang et al. |
| 2005/0079132 A1 | 4/2005 | Wang et al. |
| 2005/0107870 A1 | 5/2005 | Wang et al. |
| 2005/0150776 A1 | 7/2005 | Murakami et al. |
| 2006/0228897 A1 | 10/2006 | Timans et al. |
| 2007/0000538 A1 | 1/2007 | Shima |
| 2007/0010702 A1 | 1/2007 | Wang et al. |
| 2007/0298590 A1* | 12/2007 | Choi et al. .................. 438/478 |
| 2008/0245414 A1* | 10/2008 | Sheng et al. ................ 136/261 |
| 2008/0289686 A1* | 11/2008 | Won et al. ................... 136/256 |
| 2008/0289687 A1* | 11/2008 | Won et al. ................... 136/256 |

OTHER PUBLICATIONS

Search report and written opinion for PCT/US08/78696 dated Dec. 16, 2008.

* cited by examiner

METHOD OF DYNAMIC TEMPERATURE CONTROL DURING MICROCRYSTALLINE SI GROWTH

BACKGROUND OF THE INVENTION

1. Field of the Invention

Embodiments of the present invention generally relate to a method of dynamically controlling the temperature of a solar cell substrate during microcrystalline silicon deposition.

2. Description of the Related Art

Photovoltaic devices (PV) or solar cells are devices that convert sunlight into direct current (DC) electrical power. PV or solar cells may be single junction or multi-junction with each junction having a p-doped region, an intrinsic region, and an n-doped region to form a p-i-n structure. The intrinsic region may be formed by amorphous silicon, but amorphous silicon does not utilize as wide a spectrum of sunlight as microcrystalline silicon.

Microcrystalline silicon, on the other hand, while utilizing a wider spectrum of sunlight as compared to amorphous silicon, has a much lower absorption coefficient than amorphous silicon and therefore does not deposit at as fast as amorphous silicon. The deposition rate of microcrystalline silicon can be increased by increasing the power density, but a higher power density usually leads to a higher processing temperature. Higher processing temperatures may not be beneficial because the dopant in adjacent layers may diffuse into other layers and damage the solar cell.

Because of microcrystalline silicon's ability to use a wider spectrum of sunlight, it would be beneficial if microcrystalline silicon could be deposited at a faster rate without risk of damaging the solar cell. Therefore, there is a need in the art for a method of depositing microcrystalline silicon at a faster rate without damaging the solar cell.

SUMMARY OF THE INVENTION

The present invention generally comprises a method for dynamically controlling the temperature of a solar cell substrate during microcrystalline silicon deposition. In amorphous silicon/microcrystalline tandem solar cells, microcrystalline silicon may be deposited using a higher power density and to a greater thickness than amorphous silicon. The higher the power density applied, the faster the deposition may occur, but the temperature of the deposition may also increase. At high temperatures, the likelihood of dopant diffusing into the intrinsic layer of the solar cell and damaging the cell is greater. By dynamically controlling the temperature of the susceptor, the substrate and hence, the dopant can be maintained at a substantially constant temperature below the value at which the dopant may diffuse into the intrinsic layer. The dynamic temperature control permits the microcrystalline silicon to be deposited at a high power density without damaging the solar cell.

In one embodiment, a solar cell formation method is disclosed. The method comprises maintaining a substrate at a substantially constant temperature while dynamically controlling the temperature of a susceptor upon which the substrate is disposed. The dynamically controlling sequentially consists essentially of heating the susceptor for a first period of time, simultaneously heating the susceptor and cooling the susceptor for a second period of time, and cooling the susceptor for a third period of time.

In another embodiment, a solar cell formation method is disclosed. The method comprises depositing a silicon layer over a substrate disposed on a susceptor while maintaining the substrate at a substantially constant temperature and varying the temperature of the susceptor.

In another embodiment, a solar cell formation method is disclosed. The method comprises heating a susceptor to a first temperature by providing a heat output to the susceptor, gradually reducing the heat output to the susceptor to lower the temperature of the susceptor to a second temperature, gradually reducing the heat output to the susceptor while gradually increasing a cooling output to the susceptor to lower the temperature of the susceptor to a third temperature, and providing a substantially constant cooling output to the susceptor to substantially maintain the susceptor at the third temperature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a method for dynamically controlling the temperature of a solar cell substrate during microcrystalline silicon deposition. In amorphous silicon/microcrystalline tandem solar cells, microcrystalline silicon may be deposited using a higher power density and to a greater thickness than amorphous silicon. The higher the power density applied, the faster the deposition may occur, but the temperature of the deposition may also increase. At high temperatures, the likelihood of dopant diffusing into the intrinsic layer of the solar cell and damaging the cell is greater. By dynamically controlling the temperature of the susceptor, the substrate and hence, the dopant can be maintained at a substantially constant temperature below the value at which the dopant may diffuse into the intrinsic layer. The dynamic temperature control permits the microcrystalline silicon to be deposited at a high power density without damaging the solar cell.

The invention, as described below, may be practiced in a PECVD system available from Applied Materials, Inc., Santa Clara, Calif. It is contemplated that the invention may be practiced in other plasma processing chambers, including those from other manufacturers.

Figure 1:
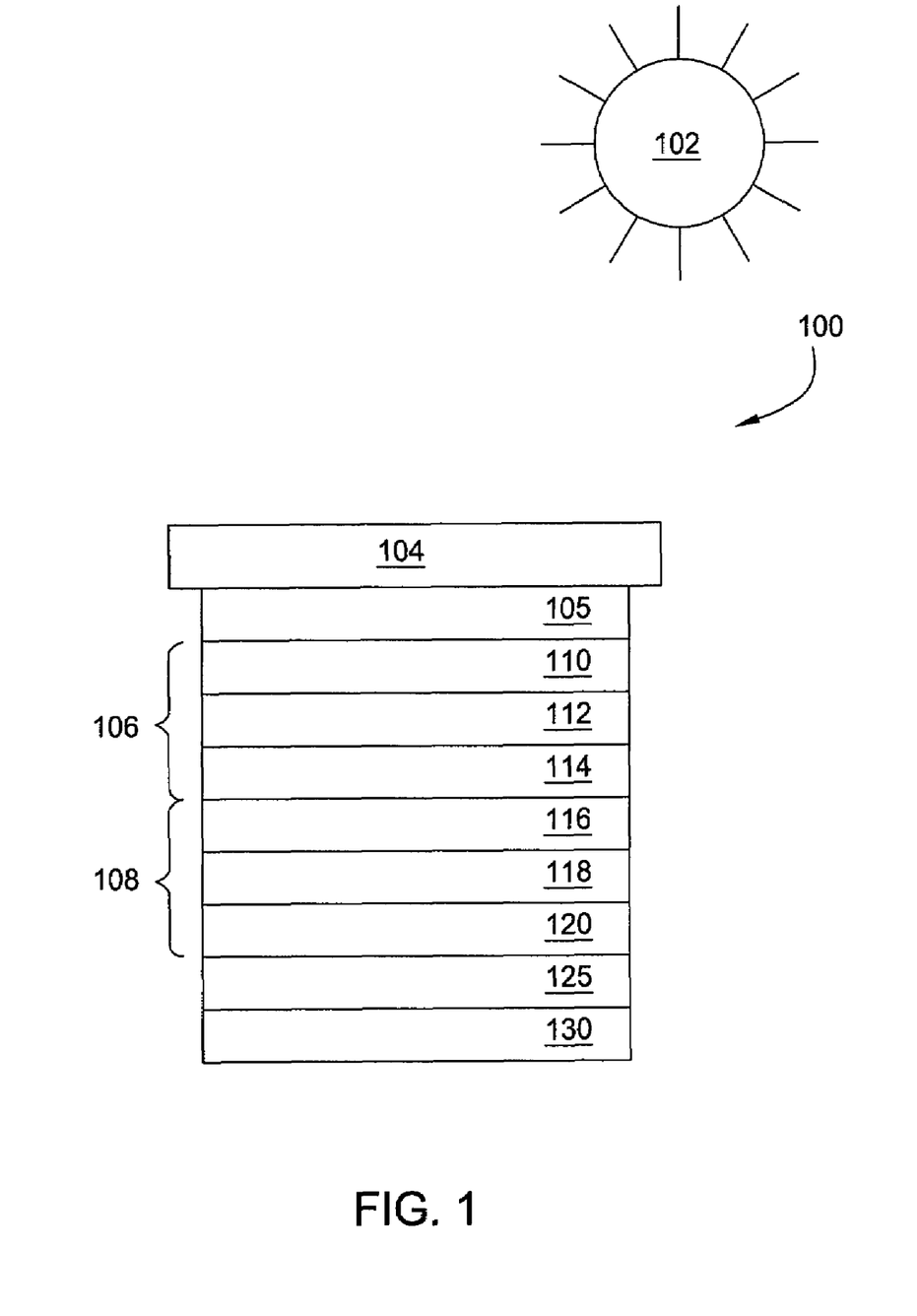
FIG. 1 is a schematic view of a dual tandem solar cell according to one embodiment of the invention.

FIG. 1 is a schematic view of a dual tandem solar cell 100 according to one embodiment of the invention. A dual tandem solar cell may be advantageous over a single junction amorphous silicon solar cell due to the wider spectrum of sunlight that may be used due to the intrinsic microcrystalline silicon layer 118. Additionally, as compared to a single junction intrinsic amorphous silicon junction, improved current for the solar cell may be present due to the serial connection of two junctions having two different band gap structures.

The solar cell 100 is shown with the substrate 104 facing the sun 102. The solar cell 100 comprises a top cell 106 and a bottom cell 108. The top cell 106 may be deposited onto the substrate 104 before the bottom cell 108. The top cell 106 may be deposited over a first transparent conductive oxide (TCO) layer 105 that may be disposed on the substrate 104. A transparent conductive oxide layer may be present between the top cell 106 and the substrate 104. A back side electrode may be deposited onto the solar cell 100 after the bottom cell 108. An optional interface layer may be present between the top cell 106 and the bottom cell 108. Over the bottom cell 108, a second TCO layer 125 and a metal backing layer 130 may be deposited. Once both the top cell 106 and the bottom cell 108 are deposited onto the substrate 104, the solar cell 100 may be flipped over so that the substrate 104 is closer to the sun 102 than the top cell 106 and the bottom cell 108. To improve light absorption by reducing light reflection, the substrate and/or one or more of thin films formed thereover may be optionally textured by wet, plasma, ion, and/or mechanical processes.

The first TCO layer 105 and the second TCO layer 125 may each comprise tin oxide, zinc oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. In one embodiment, zinc oxide comprises 5 atomic percent or less of dopants. In another embodiment, zinc oxide comprises 2.5 atomic percent or less aluminum. In certain instances, the substrate 104 may be provided by the glass manufacturers with the first TCO layer 105 already provided.

The top cell 106 may comprise a p-doped layer 110, an intrinsic layer 112, and an n-doped layer 114. The p-doped layer 110 may comprise silicon based materials doped by an element selected from Group III of the Periodic Table of Elements. In one embodiment, the p-doped layer 110 may comprise boron doped silicon. The n-doped layer 114 may comprise silicon based materials doped by an element selected from Group V of the Periodic Table of Elements. In one embodiment, the n-doped layer 114 may comprise phosphorus doped silicon. The doped silicon films 110, 114 may comprise amorphous silicon, polycrystalline silicon, or microcrystalline silicon with a thickness between about 5 nm and about 50 nm. In one embodiment, the p-doped layer 110 may be formed to a thickness between about 60 Å and about 300 Å. In one embodiment, the n-doped layer 114 may be formed to a thickness between about 100 Å and about 400 Å. The entire top cell 106 may be deposited within the same processing chamber. In one embodiment, the p-doped layer 110, the intrinsic layer 112, and the n-doped layer 114 may be deposited in separate chambers. In another embodiment, the p-doped layer 110 may be deposited in a first chamber while the intrinsic layer 112 and the n-doped layer 114 may be deposited in a second chamber. Each of the layers of the top cell 106 may be deposited by a PECVD process.

The intrinsic layer 112 may comprise intrinsic amorphous silicon. The intrinsic layer 112 may be deposited to a thickness of about 1,000 Angstroms to about 4,000 Angstroms. In another embodiment, the intrinsic layer 112 may be formed to a thickness between about 1,500 Angstroms and about 3,500 Angstroms. In one embodiment, the intrinsic layer 112 may be deposited to a thickness of about 3,000 Angstroms. The intrinsic layer 112 may be deposited using a power density (i.e., power per area of the substrate) of about 0.1 W/cm$^2$ at a temperature of about 200 degrees Celsius.

The bottom cell 108 may comprise a p-doped layer 116, an intrinsic layer 118, and an n-doped layer 120. In one embodiment, the p-doped layer 116, the intrinsic layer 118, and the n-doped layer 102 may be deposited in the same chamber. In another embodiment, the p-doped layer 116, the intrinsic layer 118, and the n-doped layer 120 may be deposited in separate chambers. In still another embodiment, the p-doped layer 116 may be deposited in a first chamber while the intrinsic layer 118 and the n-doped layer 120 may be deposited in a second chamber. The p-doped layer 116 and the n-doped layer 120 may be equivalent to those described above in relation to the top cell 106. In certain embodiments, the p-doped layer 116 may be formed to a thickness between about 100 Angstroms and about 400 Angstroms. In certain embodiments, the n-doped layer 120 may be formed to a thickness between about 100 Angstroms and about 500 Angstroms.

The intrinsic layer 118, on the other hand, may comprise intrinsic microcrystalline silicon. Microcrystalline silicon has a much lower absorption coefficient than amorphous silicon. Therefore, the intrinsic microcrystalline silicon layer 118 needs to be significantly thicker than the intrinsic amorphous silicon layer 112. In one embodiment, the intrinsic microcrystalline silicon layer 118 may be between about 10,000 Angstroms and about 30,000 Angstroms thick. In another embodiment, the intrinsic microcrystalline silicon layer 118 may be between about 1 micrometer to about 2 micrometers thick. Because the intrinsic microcrystalline silicon layer 118 is significantly thicker than the intrinsic amorphous silicon layer 112, the intrinsic microcrystalline silicon layer may take a significantly longer time to deposit compared to intrinsic amorphous silicon layer 112.

The metal back layer 130 may include, but not limited to a material selected from the group consisting of Al, Ag, Ti, Cr, Au, Cu, Pt, alloys thereof, or combinations thereof. Other processes may be performed to form the solar cell 100, such a laser scribing processes. Other films, materials, substrates, and/or packaging may be provided over metal back layer 130 to complete the solar cell. The solar cells may be interconnected to form modules, which in turn can be connected to form arrays.

Figure 2:
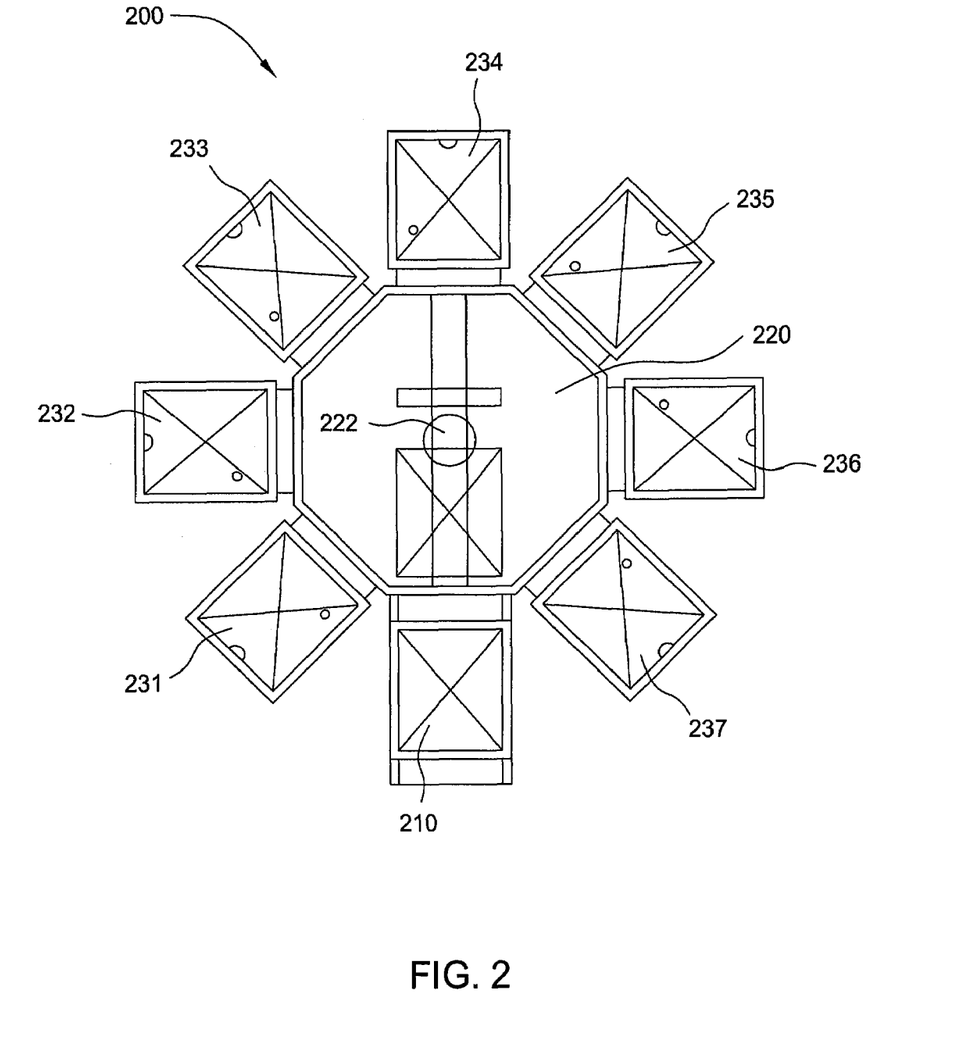
FIG. 2 is a top schematic view of one embodiment of a process system having a plurality of process chambers.
Figure 3:
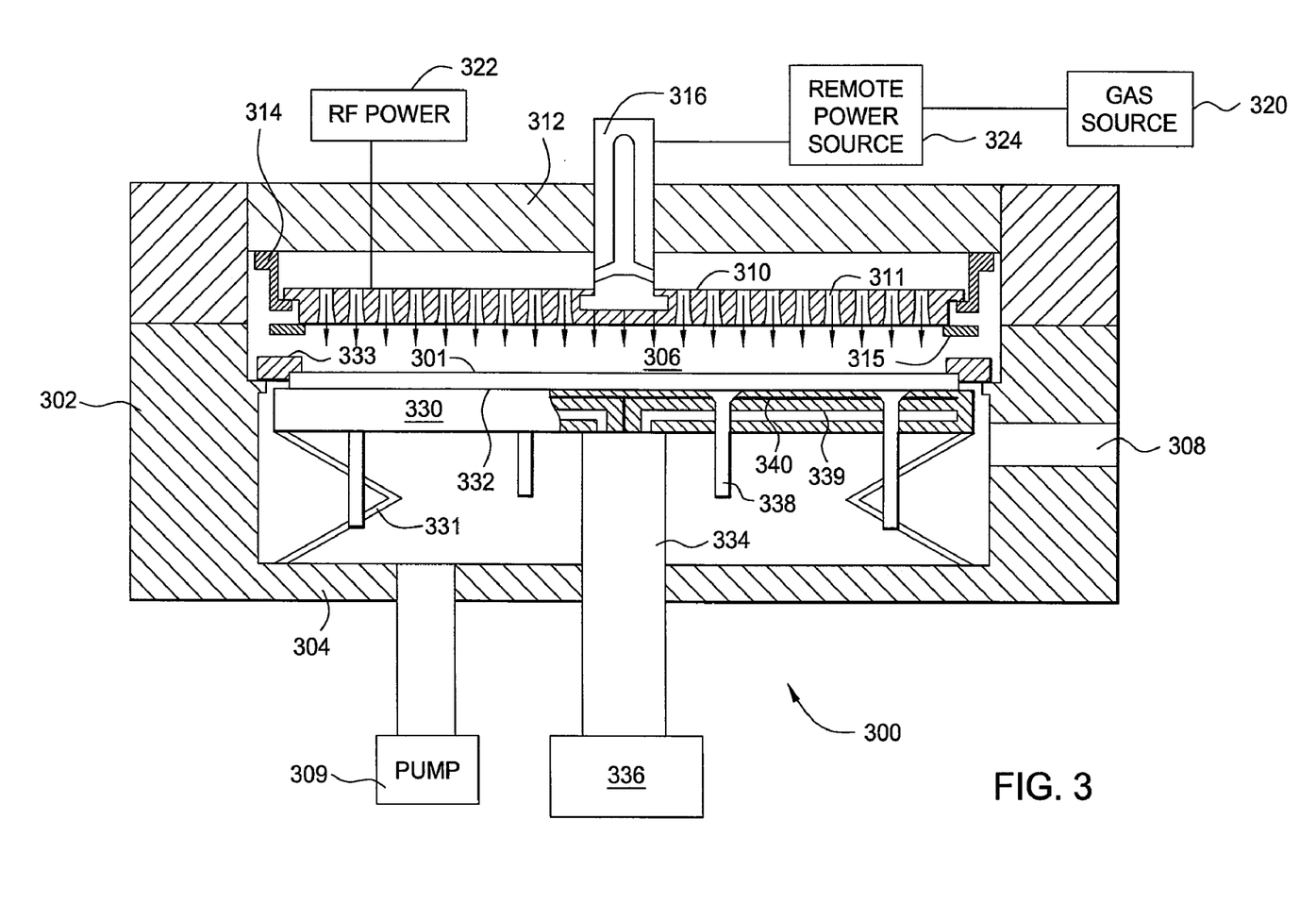
FIG. 3 is a schematic cross-section view of one embodiment of a plasma enhanced chemical vapor deposition (PECVD) chamber in which one or more films of a solar cell may be deposited.

FIG. 2 is a top schematic view of one embodiment of a process system 200 having a plurality of process chambers 231-237, such as PECVD chamber 300 of FIG. 3 or other suitable chambers capable of depositing silicon films. The process system 200 includes a transfer chamber 220 coupled to a load lock chamber 210 and the process chambers 231-237. The load lock chamber 210 allows substrates to be transferred between the ambient environment outside the system and vacuum environment within the transfer chamber 220 and process chambers 231-237. The load lock chamber 210 includes one or more evacuatable regions holding one or more substrate. The evacuatable regions are pumped down during input of substrates into the system 200 and are vented during output of the substrates from the system 200. The transfer chamber 220 has at least one vacuum robot 222 disposed therein that is adapted to transfer substrates between the load lock chamber 210 and the process chambers 231-237. Seven process chambers are shown in FIG. 2; however, the system may have any suitable number of process chambers.

FIG. 3 is a schematic cross-section view of one embodiment of a PECVD chamber 300 in which one or more films of a solar cell, such as the solar cell 100 of FIG. 1 may be deposited. One suitable PECVD chamber is available from Applied Materials, Inc., located in Santa Clara, Calif. It is contemplated that other deposition chambers, including those from other manufacturers, may be utilized to practice the present invention.

The chamber 300 generally includes walls 302, a bottom 304, and a showerhead 310, and substrate support 330 which define a process volume 306. The process volume is accessed through a valve 308 such that the substrate 301 may be transferred in and out of the chamber 300. The substrate support 330 includes a substrate receiving surface 332 for supporting a substrate and stem 334 coupled to a lift system 336 to raise and lower the substrate support 330. A shadow frame 333 may be optionally placed over periphery of the substrate 301. Lift pins 338 are moveably disposed through the substrate support 330 to move a substrate 301 to and from the substrate receiving surface 332. The substrate support 330 may also include heating elements 340 and/or cooling elements 339 to maintain the substrate support 330 at a desired temperature. The substrate support 330 may also include grounding straps 331 to provide RF grounding at the periphery of the substrate support 330.

The showerhead 310 is coupled to a backing plate 312 at its periphery by a suspension 314. The showerhead 310 may also be coupled to the backing plate by one or more center supports 316 to help prevent sag and/or control the straightness/curvature of the showerhead 310. A gas source 320 is coupled to the backing plate 312 to provide gas through the backing plate 312 and through the showerhead 310 to the substrate receiving surface 332. A vacuum pump 309 is coupled to the chamber 300 to control the process volume 306 at a desired pressure. An RF power source 322 is coupled to the backing plate 312 and/or to the showerhead 310 to provide a RF power to the showerhead 310 so that an electric field is created between the showerhead 310 and the substrate support 330 so that a plasma may be generated from the gases between the showerhead 310 and the substrate support 330. Various RF frequencies may be used, such as a frequency between about 0.3 MHz and about 200 MHz. In one embodiment the RF power source is provided at a frequency of 13.56 MHz.

A remote plasma source 324, such as an inductively coupled remote plasma source, may also be coupled between the gas source and the backing plate. Between processing substrates, a cleaning gas may be provided to the remote plasma source 324 so that a remote plasma is generated and provided to clean chamber components. The cleaning gas may be further excited by the RF power source 322 provided to the showerhead. Suitable cleaning gases include but are not limited to $NF_3$, $F_2$, and $SF_6$.

The deposition rate for microcrystalline silicon can be increased by increasing the power density. In one embodiment, about 1 $W/cm^2$ power density may be used to deposit the intrinsic microcrystalline silicon layer 118. The higher the power density, the higher the processing temperature. Whenever the processing temperature is about 240 degrees Celsius or greater, the boron dopant in the p-doped layer 110 may diffuse into the intrinsic amorphous silicon layer 112 and degrade solar cell performance. Therefore, maintaining the substrate at a temperature of less than 240 degrees Celsius is advantageous. By providing dynamic temperature control as discussed herein, the substrate temperature may be maintained at a predetermined, substantially constant temperature below 240 degrees Celsius.

Figure 4A:
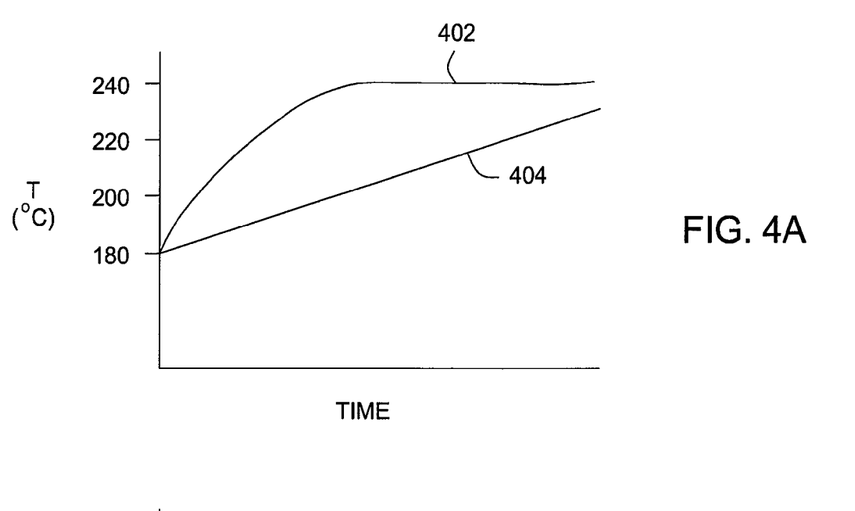
FIGS. 4A-4C are graphs showing the temperature of the substrate and the susceptor during microcrystalline silicon deposition according to embodiments of the invention.
Figure 4B:
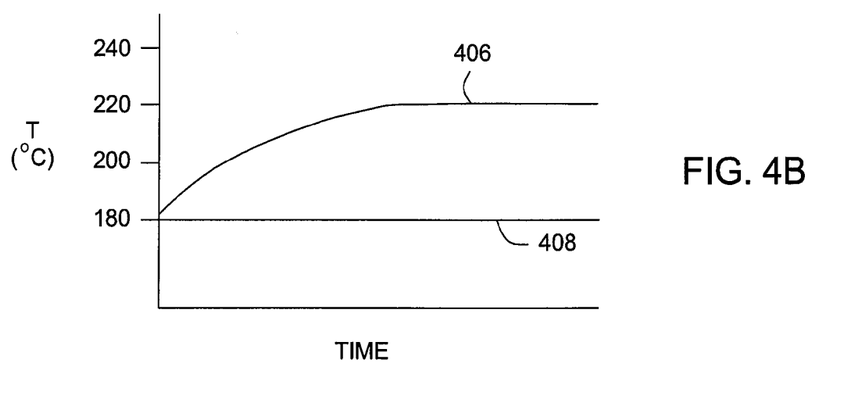
Figure 4C:
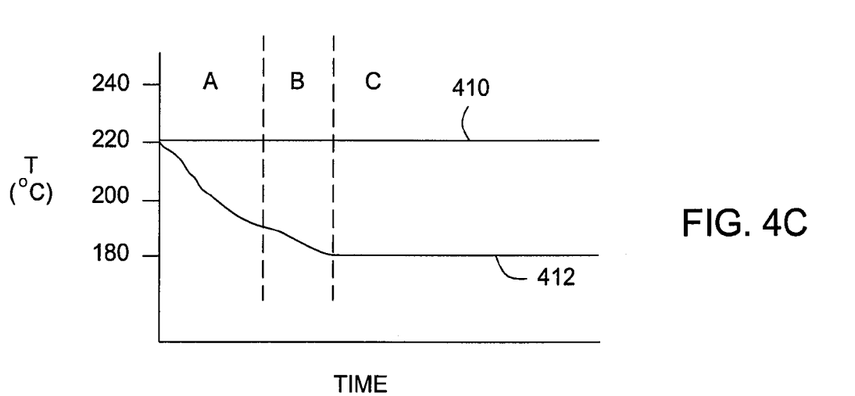

FIGS. 4A-4C are graphs showing the temperature of the substrate and the susceptor during microcrystalline silicon deposition according to embodiments of the invention. In each FIG. 4A-4C, the microcrystalline silicon was deposited at a deposition rate of about 700 Angstroms per minute while applying an RF power density of 1.2 $W/cm^2$ to deposit about 2 micrometers of microcrystalline silicon in about 28 minutes. In FIG. 4A, no active heating or cooling of the substrate or susceptor occurs, but the susceptor rises in temperature from an initial value of about 180 degrees Celsius to about 220 degrees Celsius due to the plasma as shown by line 402. The substrate, on the other hand, rises from a temperature of about 180 degrees Celsius at the start of the deposition to about 240 degrees Celsius due to the plasma as shown by line 404. The substrate reaches a temperature where the boron in the p-doped silicon layer of the top cell may diffuse into the intrinsic amorphous silicon layer of the top cell and thus degrade solar cell performance.

FIG. 4B shows the temperature of the substrate and the susceptor during an intrinsic microcrystalline silicon layer deposition process where the temperature of the susceptor is held constant as shown by line 408 at a temperature of 180 degrees Celsius by providing heating and/or cooling to the susceptor. By controlling the susceptor to a constant temperature of about 180 degrees Celsius, the temperature of the substrate may rise from its initial temperature of 180 degrees Celsius to about 220 degrees Celsius as shown by line 406. Thus, by maintaining the temperature of the susceptor at a constant temperature, the substrate temperature may be controlled to remain below the threshold temperature at which boron may diffuse into the amorphous silicon layer of the top cell.

The higher the temperature of the substrate during deposition, the better the quality of the intrinsic microcrystalline film. Thus, in the embodiment depicted in FIG. 4B, the changing temperature of the substrate causes the microcrystalline silicon to have a varying or graded quality throughout the layer of intrinsic microcrystalline silicon. FIG. 4C depicts an optimized deposition condition for deposition of an intrinsic microcrystalline silicon layer. As shown in FIG. 4C, the substrate temperature is held constant at 220 degrees Celsius as shown by line 410. The susceptor, on the other hand, starts off at a temperature of 220 degrees Celsius, but then gradually decreases to a temperature of about 180 degrees Celsius as shown by line 412. The constant substrate temperature of 220 degrees Celsius is below the threshold at which boron may diffuse into the amorphous silicon layer of the top cell, is high enough to enable a high quality intrinsic microcrystalline film to be formed, and is constant such that substantially the same quality of intrinsic microcrystalline silicon is present throughout the bottom cell.

Figure 5:
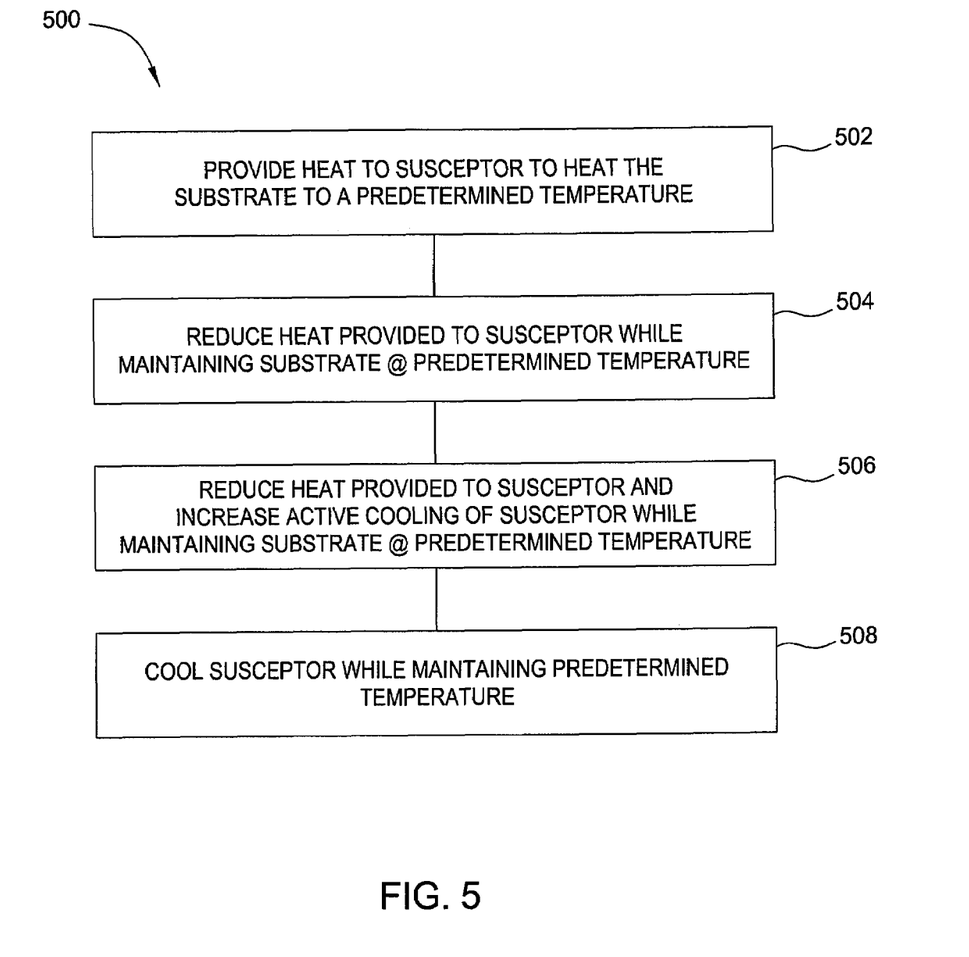
FIG. 5 is a flow chart of the dynamic temperature control process according to one embodiment of the invention.

The constant substrate temperature is accomplished by controlling the temperature of the susceptor. FIG. 5 is a flow chart 500 of the dynamic temperature control process. In region A shown in FIG. 4C, the susceptor is initially heated to a temperature of 220 degrees Celsius for the start of the microcrystalline silicon deposition (Item 502). It is to be understood that while a temperature of 220 degrees Celsius is chosen for exemplification purposes, the temperature may be selected by the user. The temperature chosen should be below the temperature at which dopant may diffuse into adjacent layers so that contamination of adjacent layers and potential failure of the solar cell device may be avoided. In one embodiment, the temperature may be between about 180 degrees Celsius to about 235 degrees Celsius. In another embodiment, the temperature may be between about 195 degrees Celsius and 205 degrees Celsius.

Once the deposition process starts, a plasma is formed in the processing chamber which could, without temperature compensation, cause the temperature of the substrate to raise as the deposition process progresses. To compensate for the heating caused by the plasma, the susceptor temperature may be reduced by lowering the amount of heating output delivered to the susceptor. Thus, the substrate maintains a substantially constant temperature by a simultaneous increase in heat supplied from the plasma and decrease in heat supplied from the susceptor (Item 504).

Thermocouples may be used to measure the substrate temperature. Real time feedback from the thermocouples to a controller permit substantially instantaneous temperature adjustment of the heating and/or cooling of the substrate by the susceptor. Therefore, any deviation from the chosen deposition temperature detected by the thermocouples may initiate a response from the susceptor in terms of the amount of heating or cooling.

Eventually, the heat of the plasma begins to heat the substrate at a faster rate than the rate at which heat supplied from the susceptor can be reduced by simply applying less heating output to the susceptor. The transition point where the heating rate of the plasma is greater than the reducing rate from the susceptor defines the boundary between region A and region B.

Within region B, the heating output delivered to the susceptor is gradually reduced while cooling output to the susceptor is initiated and gradually increased (Item 506). The increased cooling coupled with the decreased heating to the susceptor substantially balances the heating to the substrate provided by the plasma and continues to reduce the susceptor temperature. Eventually, the heating output provided to the susceptor reaches zero such that the susceptor does not add any heat to the substrate. Instead, the cooling output provided to the susceptor permits the susceptor to draw heat from the plasma and substrate such that the substrate maintains a substantially constant temperature. The transition point where heating output to the susceptor equals zero defines the boundary between region B and region C. In one embodiment, the heating output delivered to the susceptor may be eliminated altogether in region B while the cooling output to the susceptor may be adjusted accordingly to maintain the substrate at a substantially constant temperature.

Within region C, cooling output may be continually provided to the susceptor during the microcrystalline silicon deposition (Item 508). A small increase in cooling output to the susceptor may be present at the beginning of region C as the plasma may continue to increase the temperature of the processing chamber, but once the plasma has reached a steady state temperature, the cooling output to the susceptor may remain substantially constant to maintain the substrate at substantially a constant temperature and the susceptor at a substantially constant temperature. The deposition time in region C may be greater than the deposition time in region A.

One or more thermocouples may be present in the processing chamber and/or embedded within the susceptor to provide real time temperature measurements of the substrate such that a controller may control the heating output and the cooling output to the susceptor. The real time feedback permits dynamic temperature control of the susceptor to maintain the substrate at a substantially constant temperature.

The dynamic temperature control of the susceptor permits the substrate to remain at a substantially constant temperature during the intrinsic microcrystalline silicon deposition. The deposition temperature may be preselected to maximize the film qualities and deposition rate of microcrystalline silicon without degrading the solar cell. The dynamic temperature control of the susceptor may be sufficient to make the benefits of using intrinsic microcrystalline silicon versus amorphous silicon in solar cells outweigh any throughput drawbacks.

While the foregoing is directed to embodiments of the present invention, other and further embodiments of the invention may be devised without departing from the basic scope thereof, and the scope thereof is determined by the claims that follow.

The invention claimed is:

1. A solar cell formation method, comprising:
   heating a susceptor to a first temperature and a substrate to a second temperature by providing a heat output to the susceptor;
   reducing the heat output to the susceptor to lower the temperature of the susceptor to a third temperature while maintaining the substrate at the second temperature;
   reducing the heat output to the susceptor while increasing a cooling output to the susceptor to lower the temperature of the susceptor to a fourth temperature and while maintaining the substrate at the second temperature; and
   providing a substantially constant cooling output to the susceptor to substantially maintain the susceptor at the fourth temperature while maintaining the substrate at the second temperature.

2. The method of claim 1, wherein the cooling output is substantially zero during the reducing to the third temperature.

3. The method of claim 1, wherein the heating output is substantially zero during the providing a substantially constant cooling output.

4. The method of claim 1, further comprising:
   depositing a microcrystalline silicon layer over a substrate disposed on the susceptor.

5. The method of claim 4, wherein the microcrystalline silicon layer is deposited over an amorphous silicon layer deposited over the substrate.

* * * * *